United States Patent [19]

Nakabayashi

[11] Patent Number: 4,845,430
[45] Date of Patent: Jul. 4, 1989

[54] MAGNETIC RESONANCE IMAGING SYSTEM

[75] Inventor: Kazuto Nakabayashi, Ootawara, Japan

[73] Assignee: Kabushiki Kaisha Toshiba, Kawasaki, Japan

[21] Appl. No.: 67,274

[22] Filed: Jun. 29, 1987

[30] Foreign Application Priority Data

Jun. 30, 1986 [JP] Japan .............................. 61-153533

[51] Int. Cl.$^4$ ............................................. G01R 33/20
[52] U.S. Cl. ..................................... 324/309; 324/307; 324/312
[58] Field of Search ............... 324/300, 307, 309, 312, 324/313, 314, 318, 322; 128/653

[56] References Cited

U.S. PATENT DOCUMENTS

| | | | |
|---|---|---|---|
| 4,115,730 | 9/1978 | Mansfield | 324/312 |
| 4,297,637 | 10/1981 | Crooks et al. | 324/309 |
| 4,318,043 | 3/1982 | Crooks et al. | 324/309 |
| 4,411,270 | 10/1983 | Damadian | 324/309 |
| 4,458,203 | 7/1984 | Young | 324/309 |
| 4,509,015 | 4/1985 | Ordidge | 324/309 |
| 4,599,565 | 7/1986 | Hoenninger, III et al. | 324/309 |
| 4,665,467 | 5/1987 | Kramer | 324/309 |

Primary Examiner—Michael J. Tokar
Attorney, Agent, or Firm—Foley & Lardner, Schwartz, Jeffery, Schwaab, Mack, Blumenthal & Evans

[57] ABSTRACT

A magnetic resonance imaging system includes a field generation section, an excitation section, an excitation control section, a resonance data acquisition section, and an image generation section. The field generation section generates a static magnetic field, a gradient magnetic field, and a selective excitation pulse. The excitation section controls the field generation section to apply the static field, the gradient field, and the pulse to an object, at a predetermined timing, to selectively excite a magnetic resonance phenomenon in a specific slice of the object. The excitation control section controls the excitation section to excite a plurality of slices. The excitation control section causes the excitation section to excite a certain slice of the object, and causes the excitation section to excite another slice, separated from the previous slice at least by a thickness of the slice determined by the selective excitation pulse, within an excitation-repeating time. The resonance data acquisition section detects a signal induced by the magnetic resonance, to acquire data relating to the resonance. The image generation section generates an image on the basis of the resonance data.

6 Claims, 6 Drawing Sheets

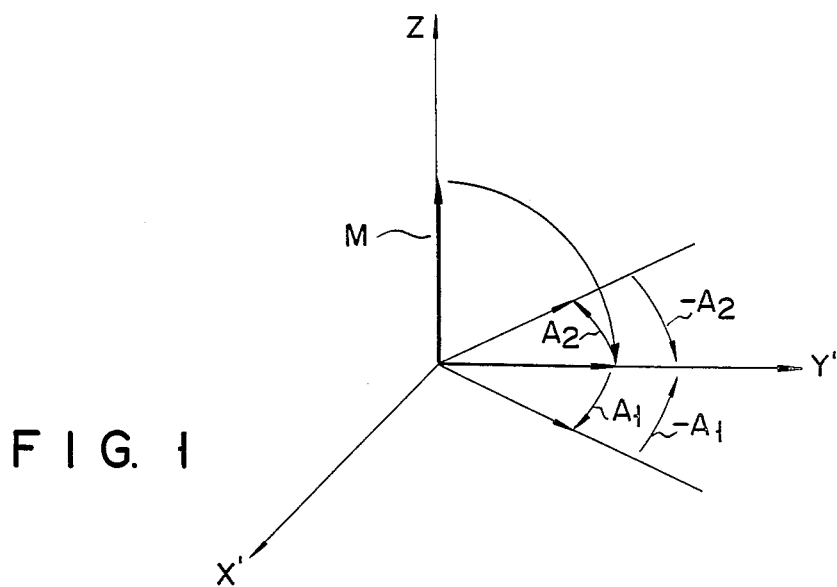
FIG. 1
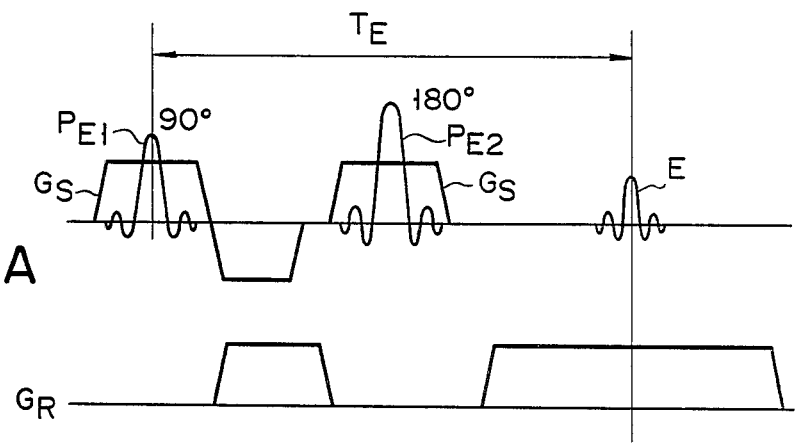
FIG. 2A
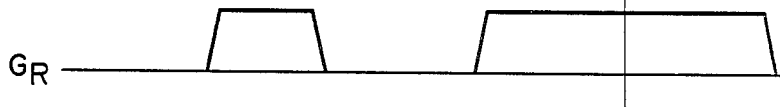
FIG. 2B
FIG. 2C

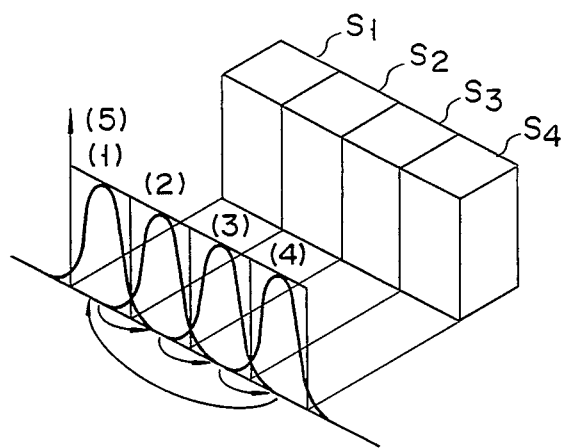
F I G. 5
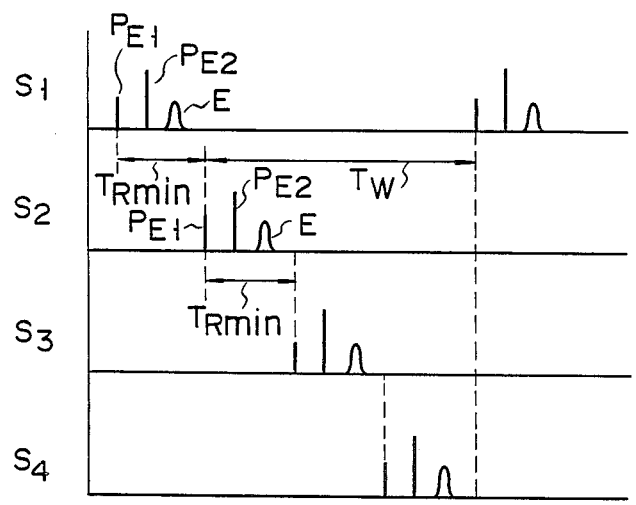
F I G. 6

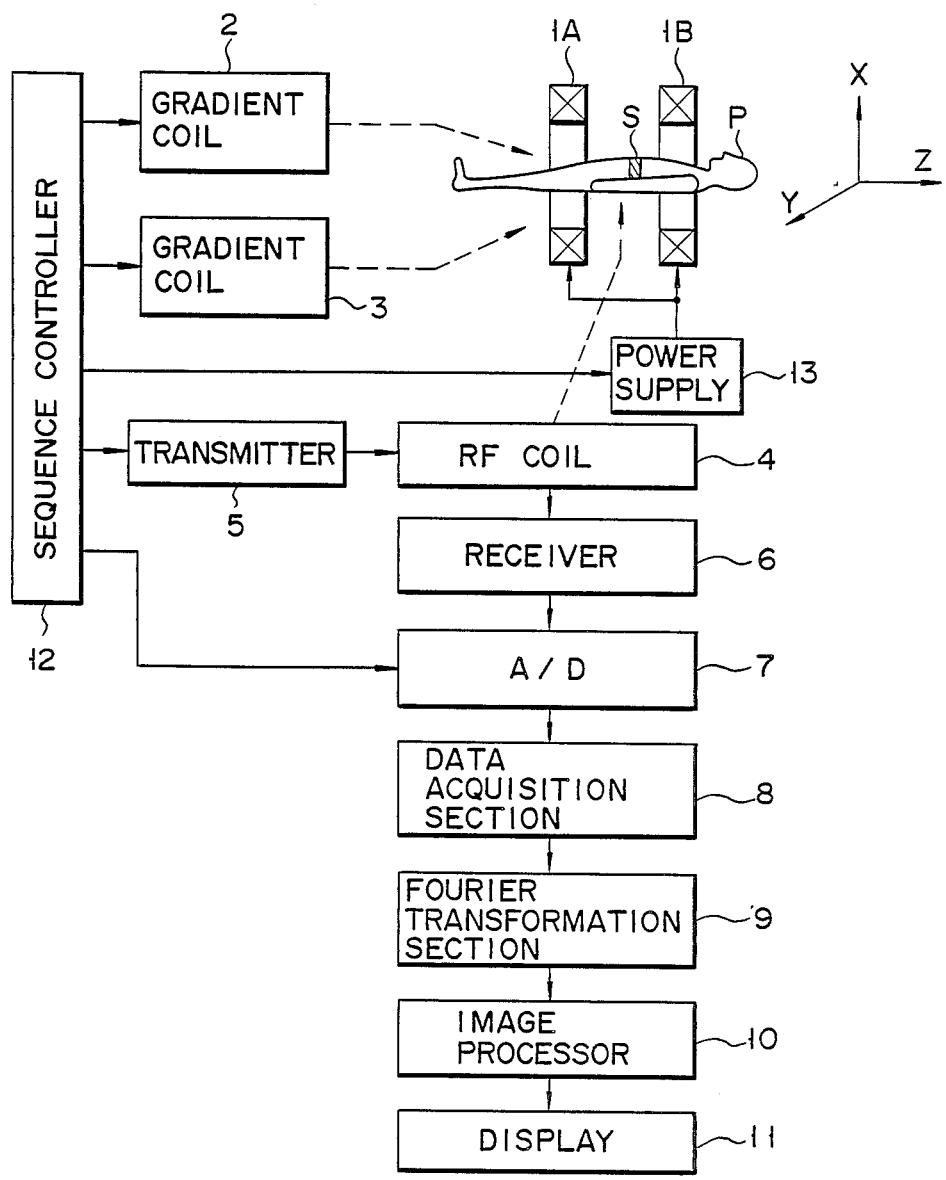
F I G. 10

MAGNETIC RESONANCE IMAGING SYSTEM

BACKGROUND OF THE INVENTION

The present invention relates to a magnetic resonance imaging (MRI) system which can significantly reduce the data acquisition time entailed in obtaining magnetic resonance (MR) images of a number of slices.

In a magnetic resonance imaging system which has already been put into practical use, a magnetic resonance phenomenon is excited, as the resonance of a magnetic moment of a nuclear spin to an electromagnetic wave. An MR signal generated by the MR phenomenon is detected, for the purpose of obtaining information about a specific atomic nucleus in the tissue of an object being examined.

A principle of the magnetic resonance imaging system will now be briefly described below.

Each atomic nucleus has its own nuclear spin. An atomic nucleus generates a magnetic moment caused by the nuclear spin. The nuclear magnetic moment of each atomic nucleus normally faces an arbitrary direction. However, when a magnetic field is applied to the nuclear magnetic moments, they are oriented in accordance with the direction of lines of magnetic force. For example, atomic nuclei having spins of ½, such as protons ($^1$H) as atomic nuclei of hydrogen, have only two types of nuclear magnetic moments, i.e., those oriented parallel to the magnetic field and in the same direction as that of the lines of magnetic force, and those oriented parallel to the magnetic field and in a direction opposite to that of the lines of magnetic force. These two types of nuclear magnetic moments in the magnetic field have energies of different levels (Zeeman fission of an energy level).

Magnetic behavior of a group of nuclear spins, i.e., nuclear magnetic moments as a whole, is known by defining macroscopic magnetization vector M. Magnetization vector M represents a vector value obtained by adding all the nuclear magnetic moments at a portion of interest of an object being examined. When the magnetic field is not applied, magnetization vector M is naturally zero. However, when the magnetic field is applied, the magnetic moments are oriented in accordance with the direction of the magnetic field, and magnetization vector M parallel to the magnetic field is generated. In accordance with normal practice in this field of art, the coordinate axis of the direction of the magnetic field is defined as the Z-axis.

When magnetization vector M is inclined with respect to the Z-axis, it commences precession thereabout. In order to incline magnetization vector M, a small magnetic field can be applied, which rotates on an X-Y plane perpendicular to a static magnetic field along the Z-axis direction. In fact, a high-frequency AC magnetic field, instead of a rotating magnetic field, is applied by a coil. At this time, in order to generate the magnetic resonance, the frequency of the high-frequency magnetic field must be set so as to coincide with the resonance frequency of a specific nuclear spin to be examined.

Inclination of magnetization vector M from a balanced position means that it transits from a low- to a high-energy level, and this transition occurs only when the frequency of the high-frequency magnetic field corresponds to a difference in the magnetic energies of the two predetermined energy levels. Resonance frequency (Larmor frequency) $\omega_0$ is equal to a value obtained by multiplying intensity $H_0$, of the magnetic field to be applied, by magnetic rotation ratio $\gamma$:

$$\omega_0 = \gamma \times H_0 \qquad (1)$$

Magnetic rotation ratio Y is a constant unique to each type of atomic nucleus having a nuclear spin. For example, a resonance frequency of the hydrogen atomic nucleus(proton) in a magnetic field of 1 T (tesla) is 42.57 MHz, and that of phosphorus 31 ($^{31}$P) is 17.24 MHz. When a frequency of the high-frequency magnetic field is arbitrarily selected to be synchronized with a specific atomic nucleus, the magnetic resonance of the atomic nucleus can be separately observed.

Therefore, according to the MRI system, a predetermined linear gradient magnetic field is applied to an object being examined disposed in a static magnetic field along the Z-axis direction, and a high-frequency excitation pulse is applied so as to incline magnetization vector M (i.e., to excite the magnetic resonance). An MR signal received by a receiving coil after the high-frequency pulse was applied is Fourier-transformed to reconstruct an image of MR information in a space. That is, the MRI system excites magnetic resonance at a predetermined portion of an object being examined, detects a weak MR signal generated by the magnetic resonance, and reconstructs an image according to MR information on the basis of the MR signal.

In such an MRI system, a position and a thickness of a slice are determined as described below.

A high-frequency excitation pulse (selective excitation pulse) consisting of a frequency component for selectively exciting only a slice having a predetermined thickness is applied to an object being examined while a gradient magnetic field in a direction (Z-axis direction) perpendicular to a static magnetic field and a slice surface is applied thereto, thereby generating an MR phenomenon only in a specific slice (this method is called a "selective excitation method").

Atomic nuclei at the excited portion start precession at the same resonance frequency and in different phases in a direction of thickness by the gradient magnetic field applied when a slice position is determined, i.e., the selected slice is excited. Such variations in phase decrease an MR signal to be detected, and quality of a finally obtained MR image is degraded.

For this reason, in order to eliminate the variations in phase to obtain a large MR signal, a gradient magnetic field having a polarity opposite to that of the gradient magnetic field applied during excitation (i.e., slice determination) is conventionally applied after excitation (i.e., slice position determination) and before MR signal acquisition.

An operation of a magnetization vector relating to the above phase shift cancelling will be described below with reference to FIG. 1. Note that a coordinate system shown in FIG. 1 is a rotating coordinate system which rotates with resonance angular frequency $\omega_0$ in the above equation (1), in which the Z-axis represents a direction of static magnetic field $H_0$, and the X'-axis represents a direction of the excitation pulse. By applying a 90° pulse, magnetization vector M in the Z-axis direction falls onto the Y'-axis. At this time, by gradient magnetic field $G_Z$ applied simultaneously with the 90° pulse, magnetization vector M tends to resonate at an angular frequency higher than resonance angular frequency $\omega_0$ in a portion having a magnetic field intensity higher than magnetic field intensity $H_0$ at the center of the slice, and hence shifts from the Y'-axis along a direction indicated by arrow $A_1$ as shown in FIG. 1. On the other hand, magnetization vector M tends to resonate at an angular frequency lower than resonance angular frequency $\omega_0$ in a portion having a magnetic field intensity lower than magnetic field intensity $H_0$ at the center of the slice, and hence shifts from the Y'-axis along a direction indicated by arrow $A_2$. Thereafter, when a gradient magnetic field having a polarity opposite to that of gradient magnetic field $G_Z$, i.e., a gradient magnetic field $-G_Z$ in which the portion having the magnetic field intensity higher than magnetic field intensity $H_0$ when gradient magnetic field $G_Z$ is applied has a lower magnetic field intensity and the portion having the magnetic field intensity lower than magnetic field intensity $H_0$ when gradient magnetic field $G_Z$ is applied has a higher magnetic field intensity is applied, magnetization vector M shifted from the Y-axis moves along $-A_1$ and $-A_2$ directions contrary to the above case. If an application time of gradient magnetic field $-G_Z$ is arbitrarily selected, directions of all magnetization vectors M in the selected slice can be aligned with the Y'-axis.

In a currently most popular method adopted in conventional MRI systems, not only magnetic resonance is excited, but also an MR echo is generated by a predetermined excitation sequences. This MR echo is detected to obtain necessary MR information.

Typical examples of a method of generating the MR echo are a pulse echo method in which the MR echo is generated using a so-called 180° pulse, and a gradient echo method in which the MR echo is generated by inverting a gradient magnetic field.

The pulse echo method uses a pulse sequence as shown in FIGS. 2A to 2C.

FIG. 2A shows a waveform of gradient magnetic field $G_S$ for determining a slice. FIG. 2A also shows envelope waveforms of excitation pulses $P_{E1}$ and $P_{E2}$ and MR echo E in addition to the waveform of gradient magnetic field $G_S$. FIG. 2B shows a waveform of gradient magnetic field $G_R$ for reading MR data, and FIG. 2C shows a waveform of gradient magnetic field $G_E$ for phase-encoding the magnetic resonance.

Phase-encoding gradient magnetic field $G_E$ and reading gradient magnetic field $G_R$ are used to cause an MR signal (MR echo) to include information of displacement on a slice as phase information.

In the pulse echo method, slice-determining gradient magnetic field $G_S$ and 90° excitation pulse $P_{E1}$ are applied first. Gradient magnetic field $G_Z$ in the Z-axis direction is normally used as slice-determining gradient magnetic field $G_S$. 90° excitation pulse $P_{E1}$ is, in this case, a selective excitation pulse having an envelope of the waveform as shown in FIG. 2A. After 90° excitation pulse $P_{E1}$ is applied, slice-determining gradient magnetic field $G_S$ is inverted so as to cancel phase shift as described above. Reading gradient magnetic field $G_R$ and phase-encoding gradient magnetic field $G_E$ are applied for a predetermined time interval after slice-determining gradient magnetic field $G_S$ is inverted. Gradient magnetic fields in directions orthogonal to each other on the X-Y plane, e.g., gradient magnetic field $G_X$ in the X-axis direction and gradient magnetic field $G_Y$ in the Y-axis direction are normally used as reading gradient magnetic field $G_R$ and phase-encoding gradient magnetic field $G_E$. After gradient magnetic fields $G_R$ and $G_E$ are applied, slice-determining gradient magnetic field $G_S$ is applied again and 180° excitation pulse $P_{E2}$ is applied. A selective excitation pulse having an envelope of the waveform as shown in FIG. 2A is also used as excitation pulse $P_{E2}$. Reading gradient magnetic field $G_R$ is applied again in a predetermined time interval after 180° excitation pulse $P_{E2}$ is applied, and MR echo E (an envelope waveform of which is shown in FIG. 2A) is detected during application of reading gradient magnetic field $G_R$. A time interval from application of excitation pulse $P_{E1}$ to the timing at which first MR echo E is generated is echo interval $T_E$. The above sequence is repeated a plurality of times by changing phase-encoding gradient magnetic field $G_E$ stepwise by a predetermined amount every time the sequence is repeated to acquire MR data. As a result, the MR data required for obtaining an image of the selected slice are acquired.

Note that when 180° excitation pulse $P_{E2}$ is used as in the above case, phase shift can be cancelled either by inverting slice-determining gradient magnetic field $G_S$ after 90° excitation pulse $P_{E1}$ is applied as described above, or by applying non-inverted slice-determining gradient magnetic field $G_S$ immediately after 180° excitation pulse $P_{E2}$ is applied.

In the gradient echo method, a pulse sequence as shown in FIGS. 3A to 3C is used.

FIG. 3A shows a waveform of slice-determining gradient magnetic field $G_S$. FIG. 3A shows waveforms of excitation pulse $P_{E0}$ and MR echo E in addition to the waveform of gradient magnetic field $G_S$. FIG. 3B shows a waveform of gradient magnetic field $G_R$ for reading MR data, and FIG. 3C shows a waveform of gradient magnetic field $G_E$ for phase-encoding magnetic resonance.

In the gradient echo method, slice-determining gradient magnetic field $G_S$ and 90° excitation pulse $P_{E0}$ are applied first. Gradient magnetic field $G_Z$ in the Z-axis direction is normally used as slice-determining gradient magnetic field $G_S$. After 90° excitation pulse $P_{E0}$ is applied, slice-determining gradient magnetic field $G_S$ is inverted so as to cancel phase shift as described above. Negative reading gradient magnetic field $G_R$ and phase-encoding gradient magnetic field $G_E$ are applied for a predetermined time interval after slice-determining gradient magnetic field $G_S$ is applied. Gradient magnetic fields in directions orthogonal to each other on the X-Y plane, e.g., gradient magnetic fields $G_X$ and $G_Y$ in the X- and Y-axis directions are normally used as reading gradient magnetic field $G_R$ and phase-encoding gradient magnetic field $G_E$, respectively. After gradient magnetic fields $G_R$ and $G_E$ are applied, reading gradient magnetic field $G_R$ is inverted, and positive reading gradient magnetic field $G_R$ is applied for a predetermined time interval, thereby detecting an MR echo E during application of reading gradient magnetic field $G_R$. A time interval from application of excitation pulse $P_{E0}$ to the timing at which first MR echo E is generated is echo interval $T_E$. The above sequence is repeated a plurality of times by changing phase-encoding gradient magnetic field $G_E$ stepwise by a predetermined amount within the positive and negative ranges every time the sequence is repeated to acquire MR data. As a result, MR data required for obtaining an image of the selected slice are acquired.

In general, when a slice once excited is to be excited again so as to acquire the MR data, the slice is excited after a resonance state caused by the previous excitation is relaxed.

When the MRI system is utilized, images of a plurality of slices spatially adjacent to each other are often required for facilitating diagnosis or for obtaining three-dimensional information. For this reason, a technique called multi-slice imaging is used in some MRI systems. According to the multi-slice imaging, other slices are excited while relaxation of resonance of nuclear spins in one excited slice is waited, thereby sequentially acquiring MR data. As a result, image data of a number of different slice positions can be acquired in a time substantially the same as that required for acquiring all the data about one slice. This technique effectively utilizes a relaxation waiting time which is essential in magnetic resonance imaging.

For example, the case wherein an image of only a single slice is acquired will be described below. FIG. 4 shows an example of an operation sequence of a typical pulse echo method in the MRI system. In this example, 90° and 180° excitation pulses $P_{E1}$ and $P_{E2}$ are applied to excite magnetic resonance to a predetermined slice, and MR data at a predetermined encoding phase is acquired. Thereafter, in order to excite magnetic resonance in the same slice so as to obtain data at the next encoding phase, waiting time $T_W$ for waiting for relaxation of resonance of a nuclear spin is required. In FIG. 4, reference symbol $T_{AQ}$ denotes an interval in which MR echo signals are acquired; and $T_E$, a time interval from excitation of magnetic resonance to the timing at which the echo signal reaches a maximum level.

Time interval $T_{AQ}$ for acquiring echo signals is determined by necessary resolution of an image and is generally $T_E > T_{AQ}$. Time interval $T_{AQ}$ is also a time interval in which reading gradient magnetic field $G_R$ is applied. Excitation pulses $P_{E1}$ and $P_{E2}$ (see FIG. 2A) are high-frequency pulses and, in general, $P_{E1}$ is a 90° pulse and $P_{E2}$ is a 180° pulse.

Assuming that a time interval for repeating excitation with respect to one slice (i.e., a time interval from the timing at which one slice is excited to the timing at which the same slice is excited again) is $T_R$, $T_R$ is obtained by the following equation:

$$T_R = T_E + (T_{AQ}/2) + T_W \quad (2)$$

where $T_E$ and $T_R$ serve as parameters reflecting relaxation times (longitudinal relaxation and transverse relaxation) $T_1$ and $T_2$ and spin density > on an image, and hence can be desirably freely selected throughout a wide range. Typical values of $T_R$ and $T_E$ used in medical diagnosis are $T_R = 300$ to 3,000 msec and $T_E = 10$ to 120 msec.

When MR data are acquired under the condition of $T_R >> T_E$, $T_W$ is increased. In time interval $T_W$, the system is merely in a waiting state and performs no meaningful processing. The multi-slice technique utilizes this time interval to excite other slices, thereby acquiring MR data.

Slice excitation by conventional multi-slice imaging will be described below with reference to FIGS. 5 and 6. FIG. 5 shows schematic examples of a plurality of spatially adjacent slices to be subjected to imaging, i.e., slices S1 to S4, and density distribution of nuclear spins in which magnetic resonance is excited. FIG. 6 shows excitation sequences of first to fourth slices $S_1$ to $S_4$.

As shown in FIG. 6, time $T_{Rmin}$ ($= T_E + (T_{AQ}/2)$) after first slice $S_1$ is excited, second slice $S_2$ is excited, and after another time $T_{Rmin}$, third slice $S_3$ is excited. Thus, a plurality of spatially adjacent slices are sequentially excited in the order of spatial arrangement, and the MR data are acquired. In this case, a frequency component (a high frequency and an envelope) of an excitation pulse is set such that nuclear spins in a slice of a predetermined thickness are excited to resonate, but the actually excited nuclear spins are distributed to a region slightly extending from the slice. Then, when a slice is excited during a waiting time of relaxation of resonance of an adjacent slice, excitation of resonance in the extending portion interferes with resonance of the adjacent slice.

It is a matter of course that each slice may be excited after a long time interval. However, since the number of data acquisitions per slice is large, a time interval for data acquisition is increased. Then, an object to be examined moves in this time interval for data acquisition, and a change in a position and/or a shape is generated in a portion or an organ in a region subjected to imaging. If an object to be examined moves in the time interval for data acquisition, an artifact is generated in an image to be reconstructed. In addition, since it takes a long time for magnetic resonance to be attenuated by relaxation, it is impossible to wait for the magnetic resonance to be attenuated to have no influence in the multi-slice imaging.

Therefore, when the multi-slice imaging is performed, a lapped portion is normally generated between adjacent slices. In this lapped portion, the remaining component of magnetic resonance by immediately preceding excitation interferes with new magnetic resonance, and adversely affects an obtained MR signal, thereby degrading quality of an MR image obtained by reconstruction, e.g., decreasing contrast.

As described above, in the multi-slice imaging, when a sequence from excitation at a certain encoding phase to data acquisition is executed with respect to one slice, excitation and data acquisition at a certain encoding phase are executed with respect to a slice spatially adjacent to the above slice, and then, excitation and data acquisition at another certain encoding phase are executed with respect to a slice next to the above slice, . . . , i.e., excitation and data acquisition are sequentially executed with respect to spatially adjacent slices. A frequency component of an excitation pulse is set so as to selectively excite only nuclear spins in a slice having a predetermined thickness. However, a distribution region of actually excited spins slightly extends from the slice as shown in FIG. 5. Therefore, when the multi-slice imaging is to be efficiently performed in a short time period, adjacent slices interfere with each other at a lapped portion therebetween. As a result, adverse influences with respect to image quality, such as a decrease in contrast of an MR image obtained by reconstruction, cannot be eliminated.

As described above, in the conventional MRI system, it is impossible to execute the multi-slice imaging in a short time period without degrading quality of an obtained MR image.

SUMMARY OF THE INVENTION

It is, therefore, an object of the present invention to provide a magnetic resonance imaging (MRI) system which is capable of executing multi-slice imaging at a high speed to obtain an image of high quality without interference between spatially adjacent slices.

The MRI system according to the present invention comprises a magnetic field generation section, an excitation section, an excitation control section, a resonance data acquisition section, and an image generation section. The magnetic field generation section generates a static magnetic field, a gradient magnetic field, and a selective excitation pulse to be applied to an object being examined. The excitation section controls the magnetic field generation section to apply the static magnetic field, the gradient magnetic field, and the excitation pulse to the object at a predetermined timing, thereby selectively exciting an MR phenomenon in a specific slice of the object. The excitation control section controls the excitation section to excite a plurality of slices. The excitation control section causes the excitation section to excite a certain slice of the object, and then causes the excitation section to excite a slice separated from the above slice by at least the thickness of a slice determined by the selective excitation pulse within a repeating time of current excitation. The resonance data acquisition section detects an MR signal induced by magnetic resonance excited by the excitation section and acquires data relating to the resonance. The image generation section generates an MR image on the basis of resonance data acquired by the data acquisition section.

In this MRI system, after a certain slice is selectively excited, at least one slice not spatially adjacent to the above slice, i.e., separated from the above slice by at least one slice is sequentially and selectively excited within a current time interval for repeating the excitation.

In this system, a slice located at a position not spatially adjacent is selectively excited every time excitation is repeated. Even when slices are sequentially changed and excited, spatially adjacent slices do not interfere with each other by excitation, and excitation of adjacent slices does not adversely affect acquired data. Therefore, even when multi-slice imaging is performed efficiently in a short time period, degradation in image quality, e.g., decrease in contrast of a reconstructed image is not generated.

Therefore, according to the system of the present invention, multi-slice MR data acquisition can be performed at a high speed, and interference between spatially adjacent slices can be prevented, thereby obtaining an MR image of high quality and good image contrast.

BRIEF DESCRIPTION OF THE DRAWINGS

FIG. 1 is a view for explaining phase shift of a resonance magnetization vector in an MR system;

FIGS. 2A, 2B and 2C are timing charts showing an example of a sequence of a magnetic field operation for excitation of magnetic resonance and resonance data acquisition;

FIG. 5 is a schematic perspective view showing an arrangement and an excitation order of a plurality of slices according to a conventional multi-slice method;

FIG. 6 is a timing chart showing an excitation sequence of a of slices shown in FIG. 5;

FIG. 10 is a block diagram showing an arrangement of the MRI system according to the first embodiment of the present invention.

DETAILED DESCRIPTION OF THE PREFERRED EMBODIMENTS

Figure 3A:
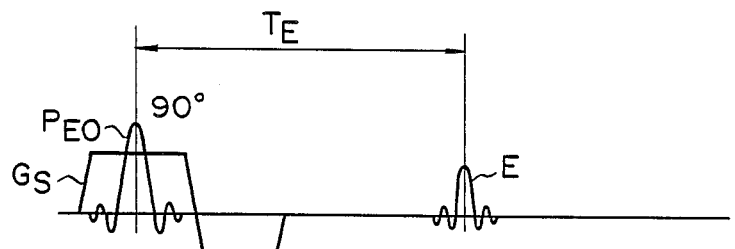
FIGS. 3A, 3B and 3C are timing charts showing another example of the sequence of the magnetic field operation for excitation of magnetic resonance and resonance data acquisition.
Figure 3B:
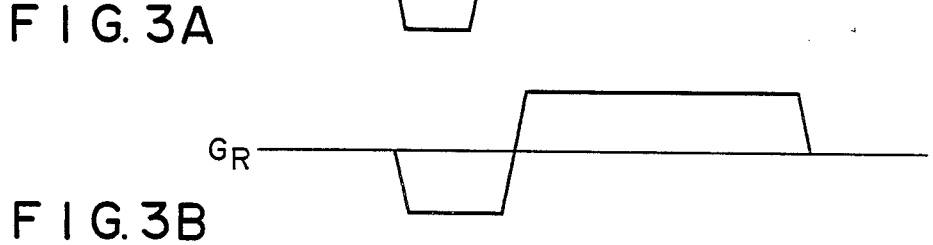
Figure 3C:
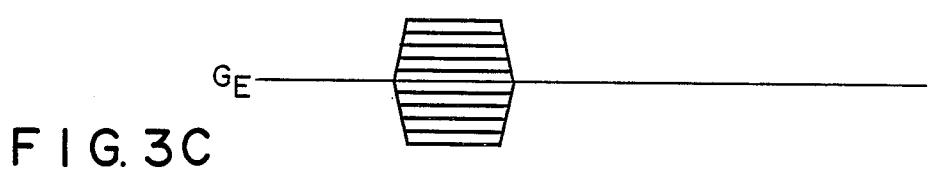
Figure 4:
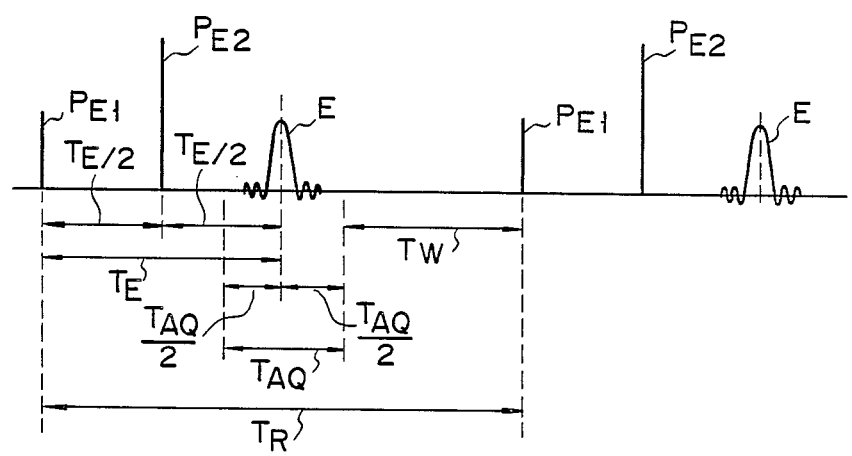
FIG. 4 is a view showing a timing relationship in magnetic resonance.
Figure 7:
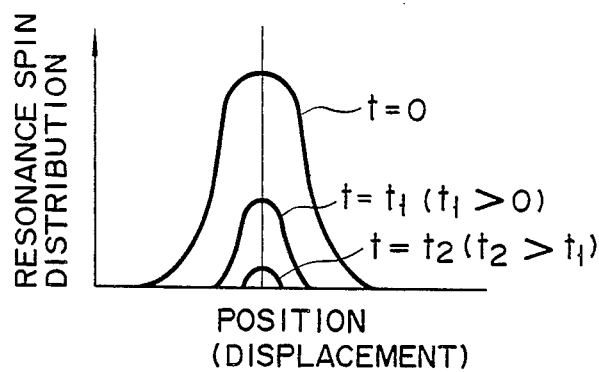
FIG. 7 is a graph showing a change over time in density distribution of resonance spin.

Nuclear spins in which magnetic resonance is excited enter into a relaxation/recovery process represented by $$e^{(t/T1)}, e^{(t/T2)}$$

with respect to time t after excitation, immediately after excitation. That is, magnetic resonance is relaxed as time t passes, and the amount and range (thickness) of a resonance spin distribution are reduced, as shown in FIG. 7. Therefore, interference caused by excitation of spatially adjacent slices is decreased as an excitation time interval is increased.

In the MRI system according to the present invention, spatially adjacent slices are not excited time-sequentially. On the contrary, a plurality of slices are excited so as not to excite spatially adjacent slices time-sequentially, and resonance data of the respective slices are acquired. Typically, spatially every other slices are sequentially excited and their resonance data are acquired. Then, the remaining slices are sequentially excited and their resonance data are acquired. That is, spatially odd-numbered slices from one end are sequentially excited, and then even-numbered slices are sequentially excited.

Figure 8:
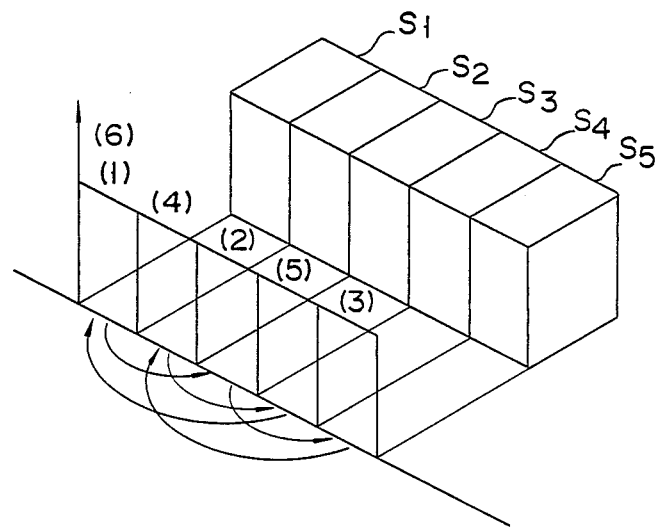
FIG. 8 is a schematic perspective view showing an arrangement and an excitation order of a plurality of slices in an MRI system according to a first embodiment of the present invention.

In the MRI system according to a first embodiment of the present invention, when the number of slices is five, slices $S_1$, $S_2$, $S_3$, $S_4$, and $S_5$ are excited not in the order of $S_1 \to S_2 \to S_3 \to S_4 \to S_5$ from one end but in the order of, e.g, $S_1 \to S_3 \to S_5 \to S_2 \to S_4 \to S_1$, i.e., jumping over at least one slice, as shown in FIG. 8.

Figure 9:
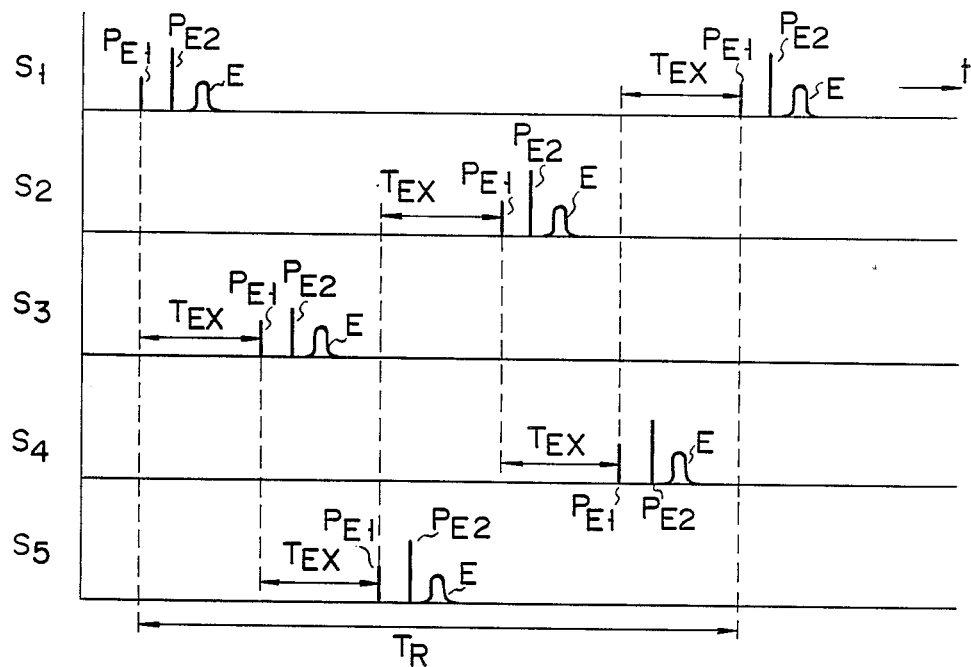
FIG. 9 is a timing chart showing an excitation sequence of a plurality of slices shown in FIG. 8.
Figure 11:
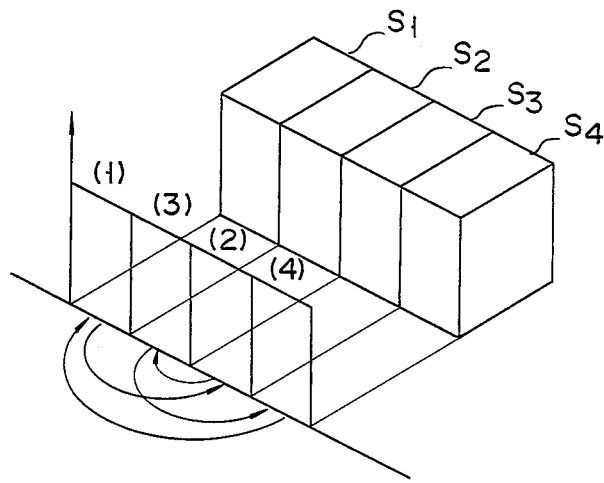
FIG. 11 is a schematic perspective view showing an arrangement and an excitation order of a plurality of slices in an MRI system according to a second embodiment of the present invention.

FIG. 9 shows an excitation sequence in this case. 90° pulse $P_{E1}$ is generated for first data acquisition of slice $S_1$, and then 180° pulse $P_{E2}$ is generated to obtain MR echo signal E. After a predetermined time interval $T_{EX}$ has passed from generation of pulse $P_{E1}$ (i.e., a time interval between excitation of a certain slice and excitation of the next slice), 90° pulse $P_{E1}$ is generated to acquire data of slice $S_3$, and then 180° pulse $P_{E2}$ is generated to obtain MR echo signal E. After another excitation time interval $T_{EX}$ has passed, in order to acquire data of slice $S_5$, 90° pulse $P_{E1}$ is generated and then 180° pulse $P_{E2}$ is generated, thereby obtaining MR echo signal E. After still another excitation time interval $T_{EX}$ has passed, in order to acquire data of slice $S_4$, 90° pulse $P_{E1}$ is generated and then 180° pulse is generated, thereby obtaining MR echo signal E. The above sequence is executed in first excitation time interval $T_R$. Then, after excitation time interval $T_{EX}$ has passed (after first excitation time interval $T_R$ has passed), 90° pulse $P_{E1}$ is generated and then 180° pulse $P_{E2}$ is generated, thereby obtaining MR echo signal E for second data acquisition of slice $S_1$. Thus, every other slices are excited so that slices not adjacent to each other are sequentially and selectively excited to acquire data.

If excitation time interval $T_{EX}$ is determined by the following equation (3), interference between slices can be effectively prevented:

$$T_{EX} = T_R / \text{Number of Multi-Slices} \qquad (3)$$

where $T_{EX} > T_{Rmin}$.

FIG. 10 shows an arrangement of the MRI system according to the first embodiment of the present invention. The system includes static coils 1A and 1B, first and second gradient coils 2 and 3, RF (radio frequency) coil 4, transmitter 5, receiver 6, A/D (analog-to-digital) converter 7, data acquisition section 8, Fourier-transformation section 9, image processor 10, display 11, sequence controller 12, and power supply 13.

A pair of static coils 1A and 1B are driven by power supply 13 and generate a uniform static magnetic field to be applied to object to be detected (patient) P. First gradient coil 2 generated gradient magnetic field $G_S$ in the Z-axis direction (normally along a body axis direction of patient P) to be applied to patient P so as to determine a position of imaging slice S. Second gradient coil 3 generates gradient magnetic fields to be applied to patient P and in a predetermined direction on the X-Y plane, i.e., reading gradient magnetic field $G_R$ and phase-encoding gradient magnetic field $G_E$. RF coil 4 is driven by transmitter 5 to apply a high-frequency magnetic field to patient P, and detects a signal caused by magnetic resonance generated in patient P, e.g., an MR echo (spin echo) and supplies it to receiver 6. Receiver 6 causes a phase detector such as an orthogonal detector to detect the MR signal detected through RF coil 4. A/D converter 7 converts the MR signal detected and extracted by receiver 6 into digital data and supplies it to data acquisition section 8. Data acquisition section 8 acquires and stores the MR data supplied through A/D converter 7. In order to improve the S/N (signal-to-noise) ratio, data acquisition section 8 accumulates the MR data sampled a plurality of times under the same condition as needed. Fourier-transformation section 9 Fourier-transforms the MR data acquired by data acquisition section 8. Image processor 10 performs predetermined processing of the data obtained by Fourier-transformation section 9 to generate an MR image. Display 11 displays the MR image generated by image processor 10. Sequence controller 12 controls gradient coils 2 and 3, transmitter 5, A/D converter 7, and power supply 13 so that excitation of magnetic resonance and acquisition of resonance data are performed in accordance with a sequence as shown in FIG. 9.

As described above, in the MRI system for exciting magnetic resonance of spins of specific atomic nuclei at specific slice portion S of an object being examined, receiving an MR signal of the magnetic resonance to acquire MR data, and performing predetermined processing including Fourier transformation, thereby obtaining an MR image of the specific atomic nuclei in this slice portion S, excitation of the magnetic resonance and acquisition of the resonance data are sequentially repeated at a predetermined timing, and during this repetition, control is performed such that spatially adjacent slices are not time-sequentially excited.

In general, even if a system is set so as to excite magnetic resonance only of nuclear spins in a slice portion, density distribution of nuclear spins in which magnetic resonance is excited actually extends to a region slightly extending from the slice portion. However, according to the above system, magnetic resonance is excited such that spatially adjacent slices are not time-sequentially selected. For this reason, even when a plurality of spatially adjacent slices are sequentially excited while selected slices are changed as needed, interference is not generated between acquired data of spatially adjacent slices. Therefore, degradation in image quality such as a decrease in contrast of a finally obtained MR image is prevented.

In order to perform multi-slice imaging efficiently in a short time period, excitation and data acquisition of a slice are preferably performed immediately after data acquisition of the previous slice is performed once, but conventional systems cannot perform multi-slice imaging in a short time period while maintaining good image quality. However, in the above system, interference of magnetic resonance is not generated between spatially adjacent slices. Therefore, according to the above system, even if multi-slice imaging is performed efficiently in a short time period, adverse influence on image quality, such as a decrease in contrast of an MR image, is not generated, and a number of MR images of high quality can be obtained in a short time period.

Note that the present invention is not limited to the above first embodiment described with reference to the drawings but can be arbitrarily modified and practiced without departing from the spirit and scope of the invention.

For example, in a second embodiment of the present invention, when imaging is to be performed for spatially adjacent four slices $S_1$, $S_2$, $S_3$, and $S_4$, slices are the order of $S_1 \rightarrow S_2 \rightarrow S_3 \rightarrow S_4$. In this case, slices $S_2$ and $S_3$ are time-sequentially excited despite that they are spatially adjacent to each other. For this reason, interference may occur between slices $S_2$ and $S_3$. However, interference does not occur between other slices, so that image quality degradation is minimal as a whole. In addition, when only an excitation time interval between slices $S_2$ and $S_3$ is made longer than other excitation time intervals, interference between slices $S_2$ and $S_3$ can be reduced.

Furthermore, the order of excitation is not limited to that in which odd-numbered slices are sequentially excited and then even-numbered slices are sequentially excited. For example, slices may be excited in the order opposite to the above order or every third or fourth slices may be excited. That is, the order can be arbitrarily set as long as spatially adjacent slices are not time-sequentially excited.

What is claimed is:

1. A magnetic resonance imaging system comprising:
   magnetic field generating means for generating a static magnetic field, a gradient magnetic field, and a selective excitation pulse, to be applied to an object being examined;
   excitation means for causing said magnetic field generating means to apply the static magnetic field, the gradient magnetic field, and the excitation pulse to the object being examined, at a predetermined timing, thereby selectively exciting a magnetic resonance phenomenon in a specific slice of the object being examined;
   excitation control means including means for causing said excitation means to excite a certain slice of the object being examined, and then causing said excitation means to excite a next successive, non-contiguous slice, separated from said certain slice by at least the thickness of a single slice, said next successive, non-contiguous slice excited subsequently by the selective excitation pulse with a corresponding magnetic gradient, within an excitation-repeating time of the slice, said excitation control means controlling said excitation means so as to excite a plurality of contiguous slices;

resonance data acquisition means for detecting a magnetic resonance signal induced by magnetic resonance excited by said excitation control means, to acquire data relating to resonance; and image generating means for generating a magnetic resonance image on the basis of the resonance data acquired by said resonance data acquisition means.

2. A system according to claim 1, wherein said excitation control means comprises means for sequentially exciting a plurality of odd-numbered slices, from one end of said plurality of contiguous slices, and then sequentially exciting a plurality of even-numbered slices.

3. A system according to claim 1, wherein said excitation control means comprises means for sequentially exciting a plurality of even-numbered slices, from one end of said plurality of contiguous slices, and then sequentially exciting a plurality of odd-numbered slices.

4. A method of obtaining a magnetic resonance image of a plurality of slices of an object being examined, in a magnetic resonance imaging system for applying a static magnetic field, a gradient magnetic field, and a selective excitation pulse to the object being examined, at a predetermined timing, to selectively excite a magnetic resonance phenomenon in a slice of the object being examined, detecting a magnetic resonance signal induced by excited magnetic resonance, and generating the magnetic resonance image on the basis of the magnetic resonance signal, said method comprising:

a first step of applying, at a predetermined timing, a predetermined static magnetic field, a gradient magnetic field, and an excitation pulse to the object being examined, to selectively excite a magnetic resonance phenomenon in a predetermined slice of said object;

a second step of detecting a magnetic resonance signal induced by magnetic resonance excited in the first step;

a third step of applying, at a predetermined timing, a predetermined static magnetic field, a gradient magnetic field, and an excitation pulse to the object being examined, after the magnetic resonance signal is detected, and selectively exciting the magnetic resonance phenomenon in a successive slice, separated from a previously excited slice by at least the thickness of a single slice, said successive slice excited subsequently by the selective excitation pulse with a corresponding magnetic gradient, within an excitation-repeating time of the slice;

a fourth step of detecting a magnetic resonance signal induced by magnetic resonance excited in the third step; and a fifth step of repeating the third and fourth steps so as to excite a plurality of contiguous slices.

5. A method according to claim 4, wherein said first and second steps include the step of applying one or a combination of a plurality of the static magnetic field, the gradient magnetic field, and the excitation pulse to the object being examined, in accordance with a predetermined sequence.

6. A method according to claim 4 wherein a plurality of slices are contiguous slices.

* * * * *